United States Patent
Chen et al.

(10) Patent No.: US 11,329,193 B2
(45) Date of Patent: May 10, 2022

(54) OPTOELECTRONIC SEMICONDUCTOR COMPONENT AND METHOD FOR PRODUCING AN OPTOELECTRONIC SEMICONDUCTOR COMPONENT

(71) Applicant: OSRAM OLED GmbH, Regensburg (DE)

(72) Inventors: Xiaojun Chen, Regensburg (DE); Alexander Frey, Lappersdorf (DE); Philipp Drechsel, Regensburg (DE); Thomas Lehnhardt, Regensburg (DE); Lise Lahourcade, Regensburg (DE); Jürgen Off, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 88 days.

(21) Appl. No.: 16/757,702

(22) PCT Filed: Oct. 19, 2018

(86) PCT No.: PCT/EP2018/078754
§ 371 (c)(1),
(2) Date: Apr. 20, 2020

(87) PCT Pub. No.: WO2019/077127
PCT Pub. Date: Apr. 25, 2019

(65) Prior Publication Data
US 2020/0365765 A1  Nov. 19, 2020

(30) Foreign Application Priority Data
Oct. 20, 2017 (DE) .......................... 102017124596.0

(51) Int. Cl.
*H01L 33/22* (2010.01)
*H01L 33/24* (2010.01)
(Continued)

(52) U.S. Cl.
CPC ............ *H01L 33/24* (2013.01); *H01L 33/007* (2013.01); *H01L 33/025* (2013.01); *H01L 33/12* (2013.01); *H01L 33/325* (2013.01)

(58) Field of Classification Search
CPC ............ H01L 51/5209; H01L 27/3262; H01L 27/3258; H01L 27/3248; H01L 27/322;
(Continued)

(56) References Cited

U.S. PATENT DOCUMENTS 6,329,667 B1   12/2001 Ota et al.
2002/0175389 A1* 11/2002 Shibata ............... H01L 21/0242
257/458
(Continued)

FOREIGN PATENT DOCUMENTS

WO   2017076117 A1   5/2017

OTHER PUBLICATIONS

Quan, Z., et al., "Roles of V-Shaped Pits on the Improvement of Quantum Efficiency in InGaN/GaN Mutiple Quantum Well Light-Emitting Diodes," American Institute of Physics, Journal of Applied Physics 116, 183107, Nov. 14, 2014, pp. 183107-1-183107-5.

*Primary Examiner* — Moin M Rahman
(74) *Attorney, Agent, or Firm* — Slater Matsil, LLP (57) ABSTRACT

An optoelectronic semiconductor component and a method for producing an optoelectronic semiconductor component are disclosed. In an embodiment an optoelectronic semiconductor component includes a semiconductor body including a first region, an active region configured to generate electromagnetic radiation, a starting region, a plurality of funnel-shaped openings and a second region, wherein the starting region is arranged between the first region and the active region, wherein the active region is arranged between the starting region and the second region, wherein the funnel-shaped openings extend from the starting region through the
(Continued)

active region as far as the second region, wherein the semiconductor body is based on a nitride compound semiconductor material, wherein the first region comprises n-doping, wherein the second region comprises p-doping, wherein the funnel-shaped openings are filled with a material of the second region, and wherein the funnel-shaped openings have a pre-determinable density, the density of the funnel-shaped openings being decoupled from a density of dislocations inside the first region.

13 Claims, 4 Drawing Sheets (51) Int. Cl.
  *H01L 33/00* (2010.01)
  *H01L 33/02* (2010.01)
  *H01L 33/12* (2010.01)
  *H01L 33/32* (2010.01)

(58) Field of Classification Search
  CPC ............ H01L 51/5225; H01L 51/5268; H01L 2251/558; H01L 2251/303; H01L 2251/306; H01L 2251/308; H01L 51/5218; H01L 51/5271; H01L 51/5275; H01L 51/0005; H01L 51/5012; H01L 51/5206; H01L 51/5221; H01L 51/56; H01L 27/3244; H01L 2227/323; H01L 33/24; H01L 33/007; H01L 33/025; H01L 33/12; H01L 33/325; H01L 33/18; H01L 33/32; H01L 27/3251; H01L 27/3267; H01L 27/3272; H01L 2227/32; H01L 2251/5338; H01L 2251/566; H01L 29/4908; H01L 51/0508; H01L 25/167; H01L 27/14643; H01L 27/3227; H01L 31/0284; H01L 31/1032; H01L 31/107; H01L 27/1462; H01L 31/028; H01L 31/02164; H01L 31/1013; H01L 31/02162; H01L 31/03762; H01L 31/202; H01L 31/022475; H01L 27/14685; H01L 27/1461; H01L 27/14692; H01L 27/14647; H01L 27/14649; H01L 31/103; H01L 27/14621; H01L 27/14605; H01L 31/03529; H01L 33/382; H01L 33/387; H01L 33/504; H01L 33/507; H01L 25/0753; H01L 27/156; H01L 33/56; H01L 33/62; H01L 2224/48091; H01L 2224/48137; H01L 33/647; H01L 33/486; H01L 2224/45144; H01L 33/54; H01L 33/641; H01L 33/60; H01L 27/30; H01L 27/3239; H01L 31/143; H01L 31/162; H01L 33/08; H01L 51/5032; H01L 25/048; H01L 27/288; H01L 27/32; H01L 33/06; H01L 33/26; H01L 51/0032; H01L 51/50; H01L 2251/50; H01L 51/5068; H01L 51/5084; H01L 51/5296; H01L 2051/0032

See application file for complete search history.

(56) References Cited

U.S. PATENT DOCUMENTS

| | | | |
|---|---|---|---|
| 2009/0289334 A1* | 11/2009 | Rachmady | H01L 29/4966 257/649 |
| 2010/0178720 A1* | 7/2010 | Lee | H01L 21/02603 438/29 |
| 2013/0082273 A1* | 4/2013 | Ting | H01L 33/325 257/76 |
| 2013/0153992 A1* | 6/2013 | Loechelt | H01L 29/7816 257/330 |
| 2015/0263232 A1 | 9/2015 | Shioda et al. | |
| 2016/0087145 A1 | 3/2016 | Kumagai et al. | |
| 2017/0294554 A1 | 10/2017 | Tani et al. | |
| 2018/0138358 A1 | 5/2018 | Zhang et al. | |
| 2018/0175243 A1* | 6/2018 | Gotschke | H01L 33/0075 |

\* cited by examiner

OPTOELECTRONIC SEMICONDUCTOR COMPONENT AND METHOD FOR PRODUCING AN OPTOELECTRONIC SEMICONDUCTOR COMPONENT

This patent application is a national phase filing under section 371 of PCT/EP2018/078754, filed Oct. 19, 2018, which claims the priority of German patent application 102017124596.0, filed Oct. 20, 2017, each of which is incorporated herein by reference in its entirety.

TECHNICAL FIELD

An optoelectronic semiconductor component and a method for producing an optoelectronic semiconductor component are provided. The optoelectronic semiconductor component may, in particular, be a radiation emitting optoelectronic semiconductor component configured to emit electromagnetic radiation, for example light, during operation.

SUMMARY OF THE INVENTION

Embodiments provide an optoelectronic semiconductor component which has an improved efficiency.

Further embodiments a method for producing such an optoelectronic semiconductor component.

According to at least one embodiment of the optoelectronic semiconductor component, the optoelectronic semiconductor component comprises a semiconductor body having a first region, an active region suitable for generating electromagnetic radiation, a starting region, a multiplicity of funnel-shaped openings and a second region. In this case, the starting region is arranged between the first region and the active region, and the active region is arranged between the starting region and the second region. Preferably, the regions are grown epitaxially. The active region preferably comprises a pn junction, a double heterostructure, a single quantum well (SQW) or, particularly preferably, a multiple quantum well (MQW) for radiation generation.

According to at least one embodiment of the optoelectronic semiconductor component, the funnel-shaped openings extend from the starting region through the active region as far as the second region. The funnel-shaped openings have their origin where dislocations occur because of defects in the lattice. Dislocations represent one-dimensional lattice defects in a crystal. The funnel-shaped openings taper from the second region in the direction of the starting region. The funnel-shaped openings pass fully through the active region.

According to at least one embodiment of the optoelectronic semiconductor component, the semiconductor body is based on a nitride compound semiconductor material. In the present context, "based on a nitride compound semiconductors" means that the semiconductor body, in particular the active layer comprises a nitride III/V compound semiconductor material, preferably $Al_nGa_mIn_{1-n-m}N$, where $0 \leq n \leq 1$, $0 \leq m \leq 1$ and $n+m \leq 1$. In this case, this material need not necessarily have a mathematically exact composition according to the formula above. Rather, it may comprise one or more dopants and additional constituents which substantially do not modify the characteristic physical properties of the $Al_nGa_mIn_{1-n-m}N$ material. For the sake of simplicity, however, the formula above contains only the essential constituents of the crystal lattice (Al, Ga, In, N), even though these may be partially replaced with relatively small amounts of further substances.

According to at least one embodiment of the optoelectronic semiconductor component, the first region comprises n-doping. This means that the first region is configured to be n-conductive and may, for example, be doped with silicon or with phosphorus.

According to at least one embodiment of the optoelectronic semiconductor component, the second region comprises p-doping. This means that the second region is configured to be p-conductive and may, for example, be doped with magnesium or with zinc.

According to at least one embodiment of the optoelectronic semiconductor component, the funnel-shaped openings are filled inter alia with the material of the second region. This advantageously leads to a large contact area between the material of the second region and the active region. A large contact area allows a reduced electrical resistance and therefore improved flow of current from the second region into the active region.

According to at least one embodiment of the optoelectronic semiconductor component, the optoelectronic semiconductor component comprises a semiconductor body comprising a first region, an active region suitable for generating electromagnetic radiation, a starting region, a multiplicity of funnel-shaped openings and a second region, wherein the starting region is arranged between the first region and the active region, wherein the active region is arranged between the starting region and the second region, wherein the funnel-shaped openings extend from the starting region through the active region as far as the second region, wherein the semiconductor body is based on a nitride compound semiconductor material, wherein the first region comprises n-doping, wherein the second region comprises p-doping, and wherein the funnel-shaped openings are filled with the material of the second region.

An optoelectronic semiconductor component as described here may be based inter alia on the following considerations. In order to reduce the electrical contact resistance between the p-doped region and the active region of the optoelectronic semiconductor component based on a nitride compound semiconductor, the introduction of funnel-shaped openings is advantageous. The density of the funnel-shaped openings has a great influence on the internal quantum efficiency of optoelectronic semiconductor component, and primarily depends crucially on the density of the dislocations in the substrate material used. This density of the dislocations in the substrate material used may be subject to large variations, which depend for example on the production process of the substrate.

The optoelectronic semiconductor component described here may make use, inter alia, of the idea of adjusting the density of the funnel-shaped openings by deliberate control of the process parameters during the epitaxial growth of the starting region. In this way, the density of the funnel-shaped openings may be adjusted independently of the density of the dislocations in the substrate material used, and more freedoms remain in the configuration of a buffer region which is used for adjusting the dislocation density. Elaborate treatment of the substrate in order to adjust the density of the dislocations may therefore advantageously be obviated. Furthermore, it is possible to use prestructured substrates with different structures (PSS patterned sapphire substrate) as well as silicon or silicon carbide substrates as growth substrates.

According to at least one embodiment of the optoelectronic semiconductor component, the funnel-shaped openings are adapted for improved charge carrier injection from the second region into the active region. An interface, advantageously enlarged by the funnel-shaped openings, between the active region and the second region facilitates the charge carrier injection into the active region. Improved charge carrier injection leads to an advantageously reduced electrical resistance of the optoelectronic semiconductor component.

According to at least one embodiment of the optoelectronic semiconductor component, the funnel-shaped openings have a pre-determinable density, and the density of the funnel-shaped openings is decoupled from a density of dislocations inside the first region. The density of the dislocations inside the first region may vary because of the use of different substrates, the use of substrates from different manufacturers, or because of machine influences. In contrast to conventional semiconductor components, the density of the funnel-shaped openings is decoupled from the density of the dislocations the variations associated therewith. This means that the density of the funnel-shaped openings is adjusted to a pre-determinable value and is not contingent on the density of the dislocations. In this way, for a multiplicity of optoelectronic semiconductor components, it is possible to achieve a consistent density of funnel-shaped openings and to compensate for variations in the density of the dislocations and machine influences on the production process. In particular, the adjustment of the density of the funnel-shaped openings to a pre-determinable value leads to a density which can be adjusted by process parameters and is not adjusted randomly. In this way, elaborate pretreatment of the substrate in order to adjust the density of the dislocations and elaborate adaptation of the production machines may be obviated.

According to at least one embodiment of the optoelectronic semiconductor component, the density of the funnel-shaped openings is at least $10^6$ cm$^{-2}$ and at most $10^{10}$ cm$^{-2}$, preferably at least $10^7$ cm$^{-2}$ and at most $10^8$ cm$^{-2}$. This ensures improved charge carrier injection without an excessively large area of the active region being affected by the funnel-shaped openings.

According to at least one embodiment of the optoelectronic semiconductor component, the density of the funnel-shaped openings is adjusted by a concentration of a dopant in the starting region, the dopant preferably being silicon or germanium. The starting point of a funnel-shaped opening is a dislocation on the surface of the first region. During the growth process of the starting region, Ga, NH$_3$ and SiH$_4$ are for example provided. Silicon combines with nitrogen to form a silicon nitride, and accumulates on the surface of the first region as porous structures. This process preferentially takes place at the dislocations. If the continuity of the porous silicon nitride structure accumulated on a dislocation is high enough to prevent further deposition of gallium nitride, a funnel-shaped opening is formed at this position. A high silicon concentration therefore leads to a high density of the funnel-shaped openings. In this way, the density of funnel-shaped openings may be adjusted by the concentration of the silicon doping or of the germanium doping.

According to at least one embodiment of the optoelectronic semiconductor component, the concentration of the dopant has a value in the range of from 0 atoms per cubic centimeter inclusive to $1 \times 10^{20}$ atoms per cubic centimeter inclusive, and preferably a value in the range of from $5 \times 10^{18}$ atoms per cubic centimeter inclusive to $5 \times 10^{19}$ atoms per cubic centimeter inclusive. In this range, the density of the funnel-shaped openings shows a dependency on the dopant concentration, in which case the dopant concentration may advantageously be selected in such a way that the function of the semiconductor component is not compromised.

According to at least one embodiment of the optoelectronic semiconductor component, the density of the funnel-shaped openings is adjusted by a growth temperature, the growth temperature preferably lying in a range of from 850° C. inclusive to 950° C. inclusive. An increase in the temperature promotes the formation of denser silicon nitride regions on the dislocations and therefore formation of the funnel-shaped openings.

According to at least one embodiment of the optoelectronic semiconductor component, the density of the funnel-shaped openings is adjusted by addition of indium, a material proportion of indium in the starting region being at least 0.1% and at most 2%. Indium is deposited on the surface of the starting region and increases the mobility of the adsorbed atoms on the surface of the starting region. The formation of funnel-shaped openings is thereby reduced.

According to at least one embodiment of the optoelectronic semiconductor component, the density of the funnel-shaped openings is adjusted by addition of aluminum, a material proportion of aluminum in the starting region being at least 1% and at most 10%. Aluminum is incorporated into the crystal lattice of the starting region and promotes the formation of funnel-shaped openings.

According to at least one embodiment of the method for producing an optoelectronic semiconductor component, the method comprises the following steps:

A) growing a buffer region on a substrate which has been provided. The substrate may, for example, comprise a sapphire substrate. The buffer region is preferably grown epitaxially on the substrate, and used to match the different lattice constants of the substrate and the subsequent semiconductor body.

B) growing a first region on the buffer region. The first region is preferably n-doped.

C) growing a starting region for funnel-shaped openings on the first region, a density of the funnel-shaped openings being adjustable and independent of a density of dislocations at the interface between the first region and the starting region. The growth conditions of the starting region are selected according to the desired density of the funnel-shaped openings. An etching process for producing the funnel-shaped openings may in this case advantageously be obviated.

D) growing an active region on the starting region. The active region contains a pn junction and is adapted for generating electromagnetic radiation.

E) growing a second region on the active region. The second region is preferably p-doped.

According to at least one embodiment of the method for producing an optoelectronic semiconductor component, a variation of the density of the dislocations inside the first region is compensated for by the density of the funnel-shaped openings. In other words, the density of the funnel-shaped openings is decoupled from the density of the dislocations inside the first region. The density of the dislocations inside the first region may be subject to large variations when using substrates from different manufacturers. Even in the event of a varying density of the dislocations because of the use of substrates from different manufacturers, the density of the funnel-shaped openings may advantageously be kept constant.

According to at least one embodiment of the method for producing an optoelectronic semiconductor component, machine-induced influences on the production of the semiconductor component are compensated for by the density of the funnel-shaped openings. Optoelectronic semiconductor components which are produced in different machines, with nominally equal process parameters, still have a variation in the density of the funnel-shaped openings. These machine-specific variations of the density of funnel-shaped openings are compensated for in order to achieve a consistent efficiency in all components.

According to at least one embodiment of the method for producing an optoelectronic semiconductor component, the density of the funnel-shaped openings is adjusted by a growth temperature, the growth temperature preferably lying in a range of from 850° C. inclusive to 950° C. inclusive. A high growth temperature promotes the formation of silicon nitride at positions of dislocations. If the region of the silicon nitride formed is configured densely enough to prevent the growth of gallium nitride, a funnel-shaped opening is formed at this position.

According to at least one embodiment of the method for producing an optoelectronic semiconductor component, the density of the funnel-shaped openings is adjusted by addition of indium, a material proportion of indium in the starting region is at least 0.1% and at most 2%. Indium is deposited on the surface of the starting region and increases the mobility of the adsorbed atoms on the surface of the starting region. The formation of funnel-shaped openings is thereby disrupted, and the density of the funnel-shaped openings is thus reduced.

According to at least one embodiment of the method for producing an optoelectronic semiconductor component, the density of the funnel-shaped openings is adjusted by addition of aluminum, a material proportion of aluminum in the starting region being at least 1% and at most 10%. Aluminum is incorporated into the crystal lattice of the starting region and promotes the formation of funnel-shaped openings, so that the density of the funnel-shaped openings increases.

According to at least one embodiment of the method for producing an optoelectronic semiconductor component, the density of the funnel-shaped openings is adjusted by a concentration of a dopant in the starting region. Preferably, the dopant is silicon or germanium, and the concentration of the dopant has a value in the range of from 0 atoms per cubic centimeter inclusive to $1 \times 10^{20}$ atoms per cubic centimeter inclusive, and preferably a value of $5 \times 10^{18}$ atoms per cubic centimeter inclusive and $5 \times 10^{19}$ atoms per cubic centimeter inclusive. The starting point of a funnel-shaped opening is a dislocation on the surface of the first region. During the growth process of the starting region, Ga, $NH_3$ and $SiH_4$ are for example provided. Silicon combines with nitrogen to form a silicon nitride, and accumulates on the surface of the first region. This process preferentially takes place at the dislocations. If the continuity of the porous silicon nitride structure accumulated on a dislocation is high enough to prevent further deposition of gallium nitride, a funnel-shaped opening is formed at this position. A high silicon concentration therefore leads to a high density of the funnel-shaped openings. In this way, the density of funnel-shaped openings may be adjusted by the concentration of the silicon doping or of the germanium doping.

BRIEF DESCRIPTION OF THE DRAWINGS

Advantageous configurations, refinements and advantages of the optoelectronic semiconductor component may be found from the following exemplary embodiments represented in connection with the figures, in which.

Elements which are the same or of the same type, or which have the same effect, are provided with the same references in the figures. The figures and the size proportions of the elements represented in the figures with respect to one another are not to be regarded as true to scale. Rather, individual elements may be represented exaggeratedly large for better representability and/or for better understanding.

DETAILED DESCRIPTION OF ILLUSTRATIVE EMBODIMENTS

Figure 1:
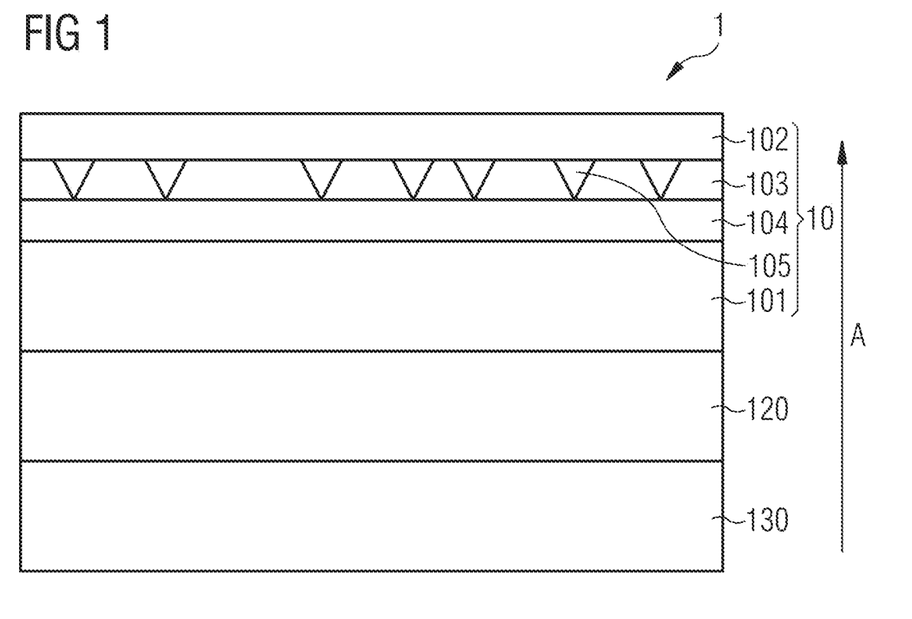
FIG. 1 shows a schematic cross section through an optoelectronic semiconductor component according to a first exemplary embodiment.

FIG. 1 shows a schematic cross section through an optoelectronic semiconductor component 1 according to a first exemplary embodiment. The optoelectronic semiconductor component 1 comprises a semiconductor body 10 having an active region 103 adapted for generation of electromagnetic radiation, a first region 101, a second region 102, a starting region 104 and a multiplicity of funnel-shaped openings 105. The semiconductor body 10 is arranged on a buffer layer 120. The buffer layer 120 is grown on a growth substrate 130. All the semiconductor layers are preferably grown epitaxially on one another, and are preferably based on a nitride compound semiconductor material in the sense defined above. The growth direction A is denoted by the adjacent arrow A, and extends orthogonally to the main extent plane of the semiconductor body 10, from the growth substrate 130 in the direction of the second region 102. The starting region 104 is the starting location for a multiplicity of funnel-shaped openings 105, the rotation axes of which are aligned parallel to the growth direction A. The funnel-shaped openings 105 taper counter to the growth direction A. The funnel-shaped openings 105 extend from the starting region 104 fully through the active region 103 as far as the second region 102, and are filled with the material of the second region 102.

The active region 130 is provided for emission of electromagnetic radiation and preferably comprises a pn junction, a double heterostructure, a single quantum well (SQW) or, particularly preferably, a multiple quantum well structure (MQW).

The first region is preferably n-doped, for example with silicon. The second region preferably comprises p-doping, and is for example doped with zinc or aluminum.

Figure 2:
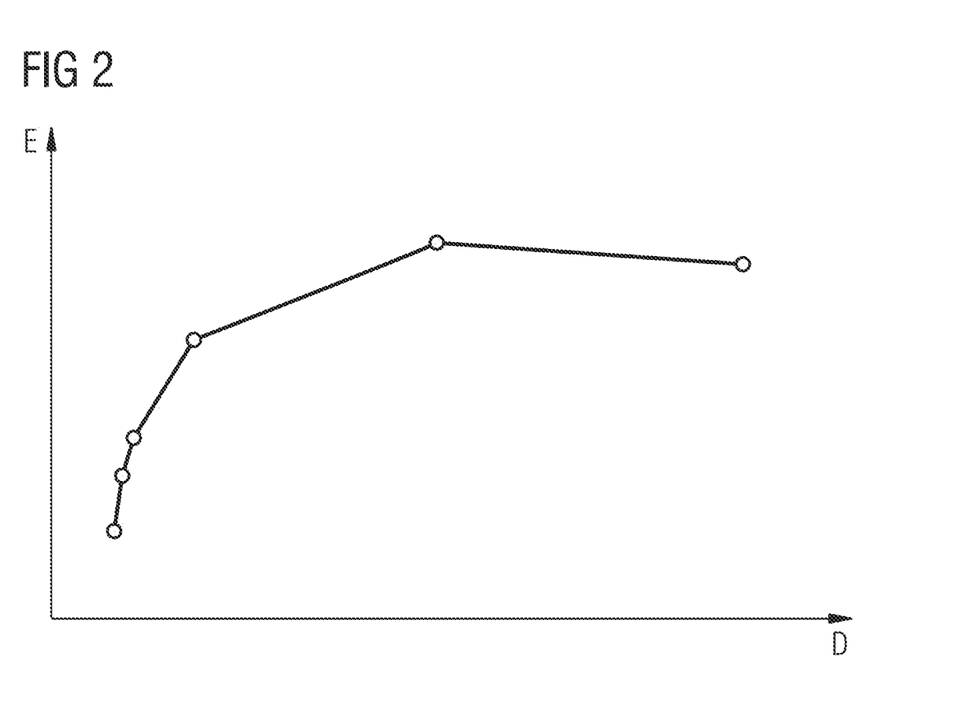
FIG. 2 shows the profile of the internal quantum efficiency of an optoelectronic semiconductor component as a function of the density of the funnel-shaped openings.

FIG. 2 shows the profile of the internal quantum efficiency of an optoelectronic semiconductor component 1 as a function of the density of the funnel-shaped openings 105 in the starting region 104. The internal quantum efficiency is plotted on the Y axis with the letter E against the X axis denoted by the letter D, which represents the density of the funnel-shaped openings 105. It can be seen from the profile of the internal quantum efficiency that there is a maximum for the internal quantum efficiency. It is therefore advantageous to be able to control the density of the funnel-shaped openings 105, i.e., to be able to adjust it to a pre-determinable value, in order to achieve an internal quantum efficiency that is as high as possible.

Figure 3:
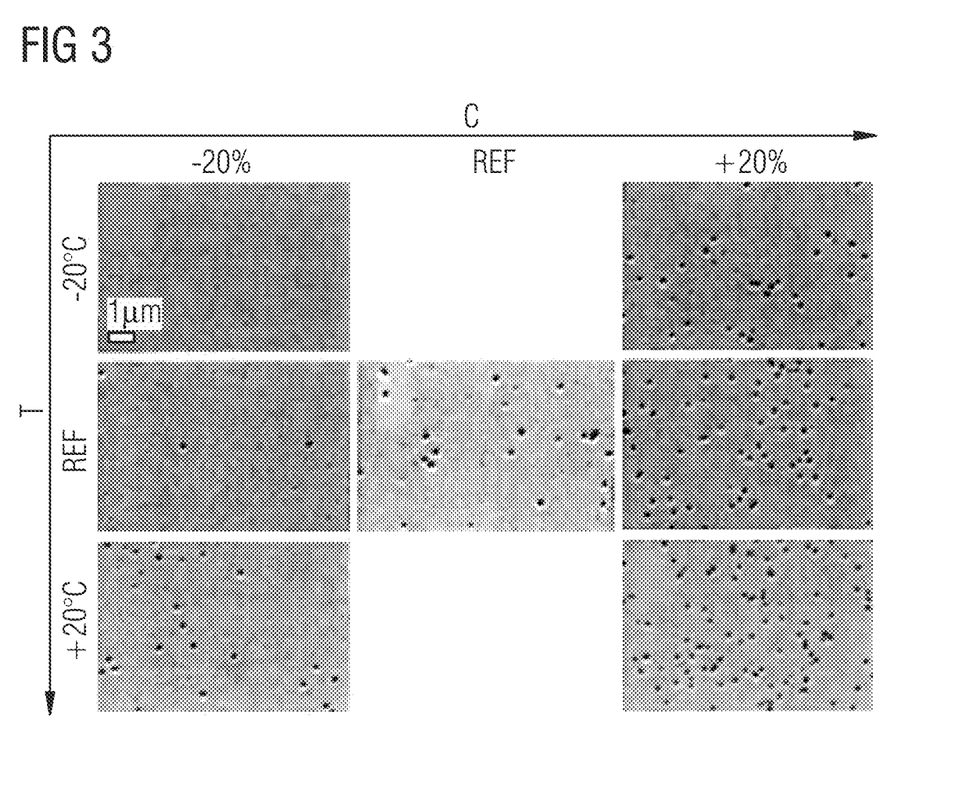
FIG. 3 shows a plan view of the active region of various optoelectronic semiconductor components, which are produced with variation of the growth temperature and dopant concentration.

FIG. 3 shows plan views of the active region 103 of various optoelectronic semiconductor components 1, which are produced while varying the growth temperature T and the dopant concentration C. The density of the funnel-shaped openings 105 in the starting region 104 and the active region 103 increases both with increasing temperature T and with increasing dopant concentration C. The reference value of the temperature T is 800° C., while the reference value of the dopant concentration C is $2.5 \times 10^{19}$ atoms per cubic centimeter. Reducing the temperature T by 20° C. leads to a reduction of the density of the funnel-shaped openings 105. Likewise, a reduction of the dopant concentration C by 20% leads to a reduction of the density of the funnel-shaped openings 105. The density of the funnel-shaped openings 105 in the active region 104 of an optoelectronic semiconductor component 1 shows a clear dependency on the growth temperature T and the dopant concentration C. These process parameters may advantageously be used in order to influence the density of the funnel-shaped openings 105.

Figure 4A:
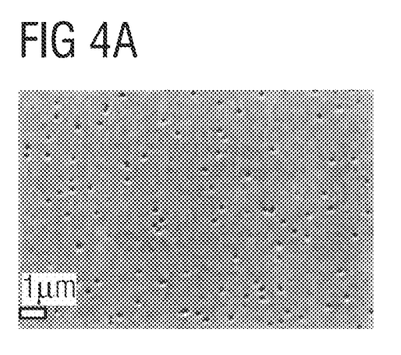
FIGS. 4A to 4C show plan views of the active region of various optoelectronic semiconductor components, which are produced with the addition of different dopants.

FIG. 4A shows a plan view of the active region 103 of an optoelectronic semiconductor component 1 according to a second exemplary embodiment. In FIG. 4A, an average density of the funnel-shaped openings 105 can be seen in the starting region 104. In this case, no dopants are added during production. FIG. 4A serves as a reference figure for FIGS. 4B and 4C.

Figure 4B:
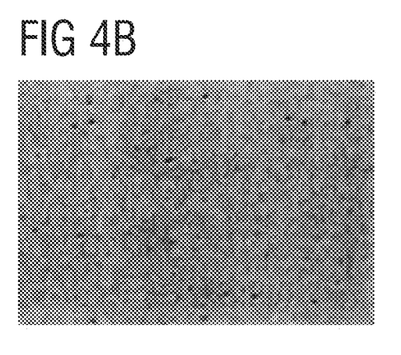

FIG. 4B shows a plan view of the active region 103 of an optoelectronic semiconductor component 1 according to a third exemplary embodiment, which is produced while adding indium during the growth process of the starting region 104. The material proportion of indium in the solid phase is in this case between 1% inclusive and 2% inclusive. The addition of indium has reduced the density of the funnel-shaped openings 105 in comparison with the reference FIG. 4A.

Figure 4C:
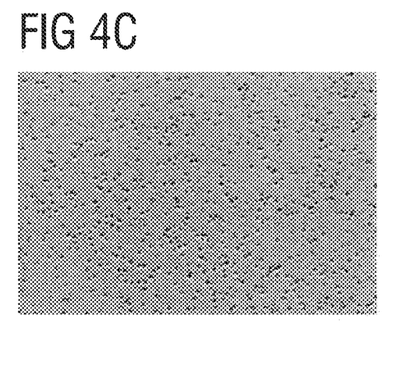

FIG. 4C shows a plan view of the active region 103 of an optoelectronic semiconductor component 1 according to a fourth exemplary embodiment which is produced while adding aluminum during the growth process of the starting region 104. The proportion of aluminum in the solid phase is in this case between 5% inclusive and 10% inclusive. The aluminum is in this case jointly incorporated solidly with the crystal lattice of the starting region 104. The density of the funnel-shaped openings 105 increases greatly because of the aluminum, as may be seen clearly in comparison with the reference FIG. 4A.

Figure 5A:
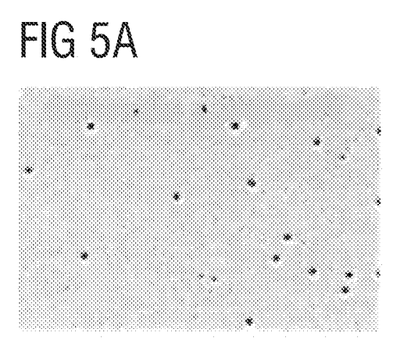
FIGS. 5A to 5C show plan views of the active region of various optoelectronic semiconductor components, which are produced on growth substrates with different dislocation densities.
Figure 5B:
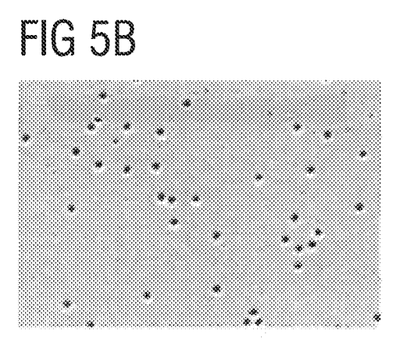
Figure 5C:
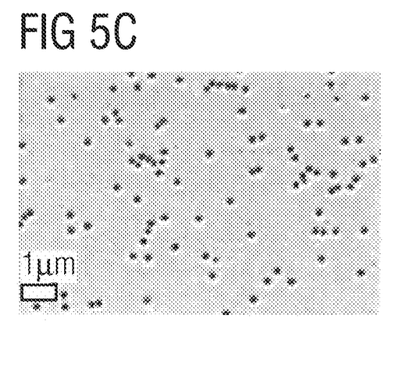

FIGS. 5A to 5C show plan views of the active region 103 of various optoelectronic semiconductor components 1, which are produced on growth substrates from different manufacturers. The process parameters used in all the production processes are nominally the same. Nevertheless, the density of the funnel-shaped openings 105 varies greatly in FIGS. 5A, 5B and 5C because of the different densities of the dislocations in the growth substrates. This result illustrates the advantage of control, or deliberate adjustability, of the density of the funnel-shaped openings 105 in order to compensate for the deviations due to the substrate.

Figure 6A:
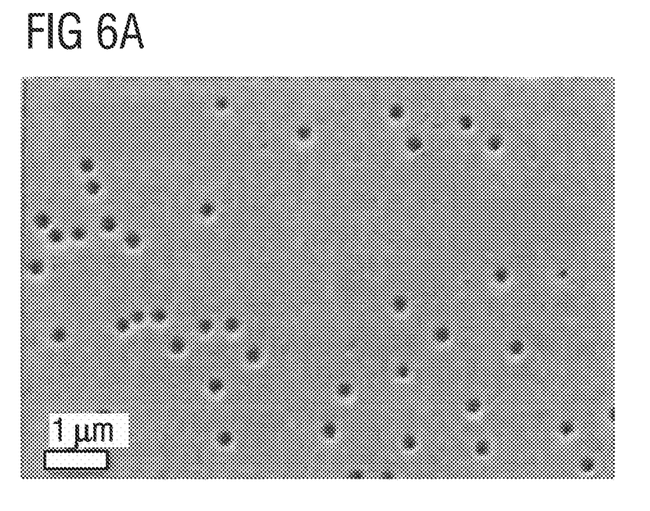
FIGS. 6A and 6B show plan views of the active region of various optoelectronic semiconductor components, which are produced with identical growth parameters of different production machines.
Figure 6B:
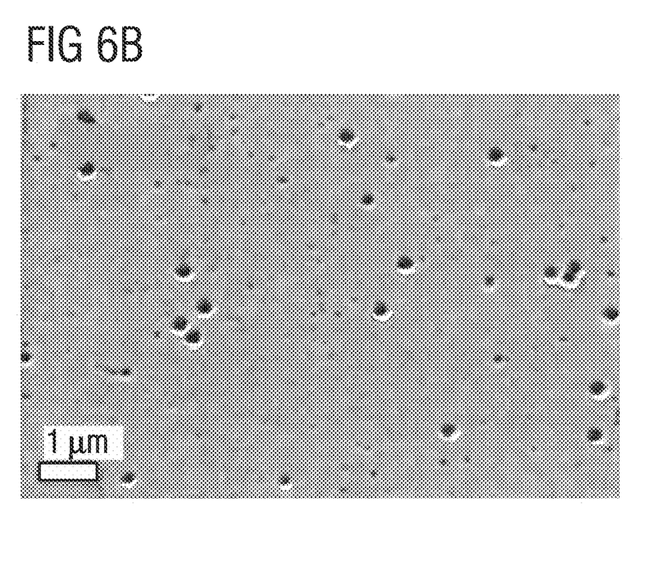

FIGS. 6A and 6B show plan views of the active region 103 of various optoelectronic semiconductor components 1, which are produced with identical process parameters and growth substrates by different production machines. It is in this case clear that the densities of the funnel-shaped openings 105 differ from one another from FIG. 6A to FIG. 6B. Advantageously, with the measures described above, a machine influence on the density of the funnel-shaped openings 105 may be controlled and possibly compensated for.

The description with the aid of the exemplary embodiments does not restrict the invention. Rather, the invention comprises any new feature and any combination of features, which includes in particular any combination of features in the patent claims, even if this feature or this combination is not itself explicitly indicated in the patent claims or the exemplary embodiments.

The invention claimed is:

1. An optoelectronic semiconductor component comprising:
   a semiconductor body comprising:
   a first region;
   an active region configured to generate electromagnetic radiation;
   a starting region;
   a plurality of funnel-shaped openings; and
   a second region,
   wherein the starting region is arranged between the first region and the active region,
   wherein the active region is arranged between the starting region and the second region,
   wherein the funnel-shaped openings extend from the starting region through the active region as far as the second region,
   wherein the semiconductor body is based on a nitride compound semiconductor material,
   wherein the first region comprises n-doping,
   wherein the second region comprises p-doping,
   wherein the funnel-shaped openings are filled with a material of the second region,
   wherein the funnel-shaped openings have a pre-determinable density, the density of the funnel-shaped openings being decoupled from a density of dislocations inside the first region, and
   wherein the density of the funnel-shaped openings is adjusted by an addition of indium,
   a material proportion of indium in the starting region lying between 0.1% inclusive and 2% inclusive.

2. The optoelectronic semiconductor component of claim 1, wherein the funnel-shaped openings are adapted for improved charge carrier injection from the second region into the active region.

3. The optoelectronic semiconductor component of claim 1, wherein the density of the funnel-shaped openings is at least $10^6$ cm$^{-2}$ and at most $10^{10}$ cm$^{-2}$.

4. The optoelectronic semiconductor component of claim 1, wherein the density of the funnel-shaped openings is adjusted by a concentration of a dopant in the starting region, the dopant being silicon or germanium.

5. The optoelectronic semiconductor component of claim 4, wherein a value of a dopant concentration is in a range from atoms per cubic centimeter inclusive to $1 \times 10^{20}$ atoms per cubic centimeter inclusive.

6. The optoelectronic semiconductor component of claim 1, wherein the density of the funnel-shaped openings is adjusted by a growth temperature, the growth temperature lying in a range from 850° C. inclusive to 950° C. inclusive.

7. The optoelectronic semiconductor component of claim 1, wherein the density of the funnel-shaped openings is adjusted by an addition of aluminum, a material proportion of aluminum in the starting region lying between 1% inclusive and io% inclusive.

8. An optoelectronic semiconductor component comprising:
   a semiconductor body comprising:
   a first region;
   an active region configured to generate electromagnetic radiation;
   a starting region;
   a plurality of funnel-shaped openings; and
   a second region,
   wherein the starting region is arranged between the first region and the active region,
   wherein the active region is arranged between the starting region and the second region,
   wherein the funnel-shaped openings extend from the starting region through the active region as far as the second region,
   wherein the semiconductor body is based on a nitride compound semiconductor material,
   wherein the first region comprises n-doping,
   wherein the second region comprises p-doping,
   wherein the funnel-shaped openings are filled with a material of the second region,
   wherein the funnel-shaped openings have a pre-determinable density, the density of the funnel-shaped openings being decoupled from a density of dislocations inside the first region, and
   wherein the density of the funnel-shaped openings is adjusted by an addition of aluminum, a material proportion of aluminum in the starting region lying between 1% inclusive and 10% inclusive.

9. The optoelectronic semiconductor component of claim 8, wherein the funnel-shaped openings are adapted for improved charge carrier injection from the second region into the active region.

10. The optoelectronic semiconductor component of claim 8, wherein the density of the funnel-shaped openings is at least $10^6$ cm$^{-2}$ and at most low $10^{10}$ cm$^{-2}$.

11. The optoelectronic semiconductor component of claim 8, wherein the density of the funnel-shaped openings is adjusted by a concentration of a dopant in the starting region, the dopant being silicon or germanium.

12. The optoelectronic semiconductor component of claim 11, wherein a value of a dopant concentration is in a range from o atoms per cubic centimeter inclusive to $1\times10^{20}$ atoms per cubic centimeter inclusive.

13. The optoelectronic semiconductor component of claim 8, wherein the density of the funnel-shaped openings is adjusted by a growth temperature, the growth temperature lying in a range from 850° C. inclusive to 950° C. inclusive.

* * * * *

UNITED STATES PATENT AND TRADEMARK OFFICE
CERTIFICATE OF CORRECTION

PATENT NO. : 11,329,193 B2
APPLICATION NO. : 16/757702
DATED : May 10, 2022
INVENTOR(S) : Xiaojun Chen et al.

Page 1 of 1

It is certified that error appears in the above-identified patent and that said Letters Patent is hereby corrected as shown below:

In the Claims

Claim 7, Column 9, Line 3; delete "io" and insert --10--

Signed and Sealed this
Twenty-first Day of June, 2022

Katherine Kelly Vidal
*Director of the United States Patent and Trademark Office*